United States Patent [19]

Kostelec

[11] E Re. 29,261

[45] Reissued June 7, 1977

[54] GATED SILICON DIODE ARRAY CAMERA TUBE

[75] Inventor: Joze Kostelec, Stamford, Conn.

[73] Assignee: North American Philips Corporation, New York, N.Y.

[22] Filed: Apr. 9, 1976

[21] Appl. No.: 675,646

Related U.S. Patent Documents

Reissue of:

[64] Patent No.: 3,916,429
Issued: Oct. 28, 1975
Appl. No.: 433,286
Filed: Jan. 14, 1974

U.S. Applications:

[63] Continuation of Ser. No. 209,533, Dec. 20, 1971, abandoned.

[52] U.S. Cl. ..... 357/31
[51] Int. Cl.[2] ..... H01L 27/14
[58] Field of Search ..... 357/31, 30

[56] References Cited

UNITED STATES PATENTS 3,703,669 11/1972 London ..... 317/235 R

*Primary Examiner*—Martin H. Edlow
*Attorney, Agent, or Firm*—Frank R. Trifari; Carl P. Steinhauser

[57] ABSTRACT

A silicon diode array camera tube employs a p-n junction to perform gating and provide electronic gain control.

9 Claims, 4 Drawing Figures

GATED SILICON DIODE ARRAY CAMERA TUBE

Matter enclosed in heavy brackets [ ] appears in the original patent but forms no part of this reissue specification; matter printed in italics indicates the additions made by reissue.

This is a continuation of application Ser. No. 209,533, filed Dec. 20, 1971, now abandoned.

The invention relates to a silicon diode array camera tube employing a p-n junction to perform gating and provide electronic gain control.

A camera tube employing a silicon diode array has been described in U.S. Pat. No. 3,011,089. A silicon wafer of one conductivity type is provided with islands of the opposite conductivity type providing an array of p-n junctions or diodes. A light image is formed on a surface of the wafer opposite the islands, the other surface containing the islands of opposite conductivity type being scanned by an electron beam. The electron beam, the diameter of which is larger than that of a single island, periodically charges the p-type islands down to cathode (ground) potential while the potential of the n-type material is held at suitable positive voltage. This potential difference can be sustained for a normal television frame so long as the dark current is not high enough to discharge the diodes during this frame time.

In order to isolate the n-type substrate from the beam, a thin layer of silicon dioxide ($SiO_2$), an insulator covers the wafer on the side facing the electron beam, except for the islands of opposite conductivity type as described in U.S. Pat. No. 3,403,284. The $SiO_2$ film, also charged down to cathode potential by the beam, remains there and isolates the substrate from the beam. The incident light associated with the image is absorbed in the silicon wafer, creating hole-electron pairs. Since the absorption coefficient for silicon for visible light is greater than 3,000 $cm^{-1}$, most of the hole-electron pairs will be generated near the incident surface while longer wave-lengths are absorbed throughout the layer; the minority carriers (holes) then diffuse to the depletion region of the diodes, discharging the diodes by an amount proportional to the light intensity. The recharging of the diodes by the scanning beam creates the video signal.

Since $SiO_2$ is an insulator, it stores charge when struck by an electron beam which adversely affects the charging of the diodes. Consequently, this layer is covered by an extremely thin layer of resistive material such as hafniumtantalum nitride, antimony tri-sulfide and others referred to as a resistive sea, which conducts the charge away to the neighboring diodes.

In some applications it may be desirable to gate the diode array much the same as a shutter closes the light path in a camera and camera tubes have been proposed using a gated diode or MOS capacitor gate on the imaging side of the wafer.

It is a principal object of the invention to improve such a camera type by providing an internal gate which can operate to prevent, or permit the generation of a signal, as desired.

It is a further object of the invention to provide a camera tube having intermediate levels of image sensing capabilities.

It is a still further object of the invention to provide a camera tube employing a planar silicon diode array target with electronic gain control.

These and further objects of the invention will appear to as the specification progresses.

In accordance with the invention a gating diode is provided between successive islands which are the photodiodes. The gating diode, unlike the photodiodes, is covered by the silicon dioxide layer and is biassed normally so that it is at the same potential as the n-type substrate so that the light-generated carriers are collected by the photodiodes and the signal is observed as in a normal silicon diode array camera tube. However, the gated diode may be reversed biassed so that the depletion region spreads into the high resistivity substrate and photogenerated carriers are collected by the gate diode and cannot reach the photodiode. In this state the gate is closed and no signal can be observed.

It is also possible to obtain intermediate levels of sensing capabilities by applying various values of reverse bias to the gating diode. Thus, an electronic gating control may be achieved with the gating diode.

The invention will be described with reference to the accompanying drawing in which.

Figure 1:
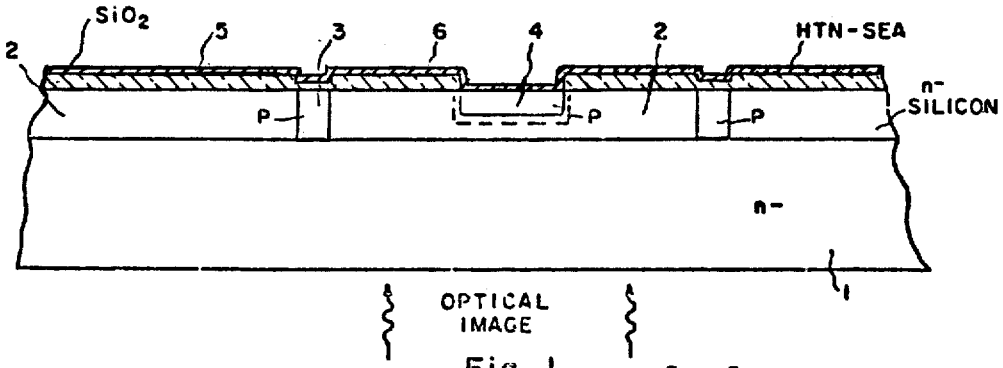
FIG. 1 shows, in cross-section, a unit cell of a silicon diode target array of a camera tube according to the invention.

A target for a gated silicon diode array camera tube as shown in FIG. 1 comprises a silicon wafer on one side of which an optical image is formed. The wafer has a region 1 which is about 100 Ω-cm n-type silicon with a region 2 of a thin (2–5$\mu$) epitaxially deposited 1.0 Ω-cm n-type (Sb or As-doped) layer. Gating diodes 3 and photodiodes 4 of p-type silicon are formed by diffusing boron through photolighographically etched holes in the thermally grown $SiO_2$ layer covering the n-type substrate. The surface of the wafer except for the islands formed by the photodiodes is covered by a thin insulating layer 5 of silicon dioxide. The silicon dioxide layer is covered by a thin resistive layer 6 of hafniumtantalum nitride or other suitable resistive sea which conducts away accumulated charge.

The same target structure outlined above can be constructed in a uniformly doped n-type silicon substrate. The processing steps are identical to those for the previously discussed structure. The gating efficiency for all wavelengths is essentially 100 percent since the depletion region of the gate diode can push the depletion region of reverse diodes completely to the p-island.

Figure 4:
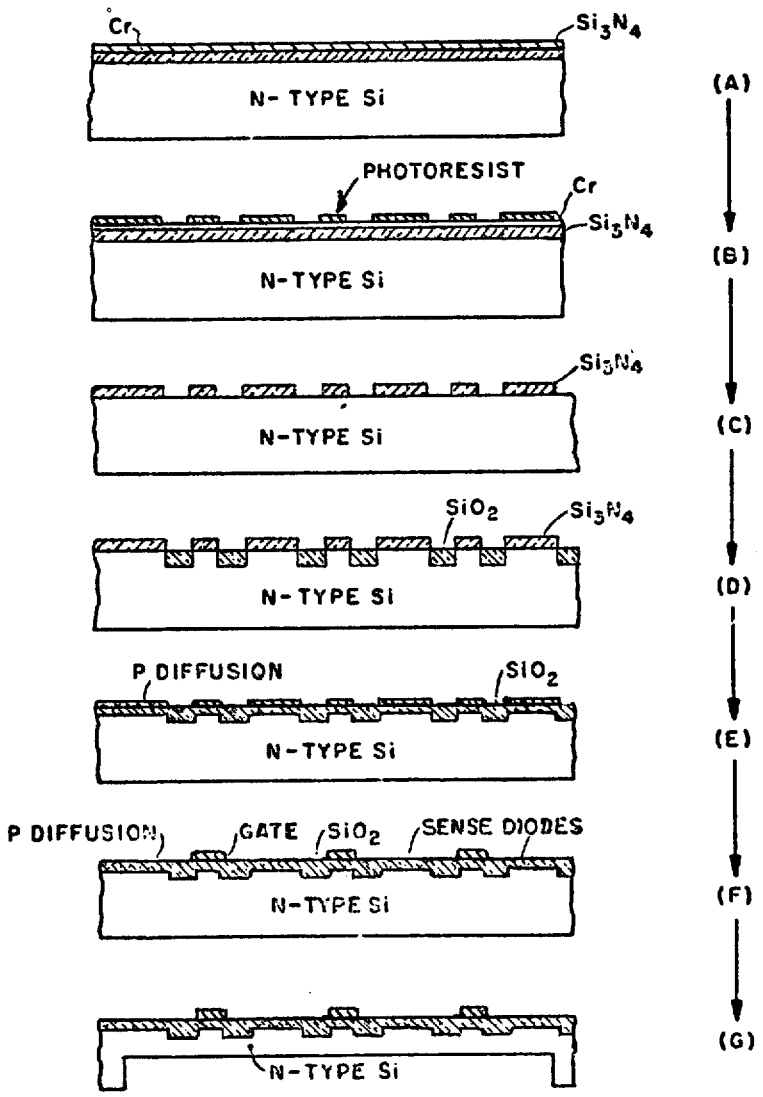
FIG. 4 is a flow diagram illustrating a process for making a tube target according to the invention.

Another method of fabricating the gated diode target is by means of the "LOCOS" process. The steps are as follows (see FIG. 4):

A. A silicon wafer is coated with an $Si_3N_4$ layer formed by pyrolitic deposition, and the $Si_3N_4$ is coated with an evaporated Cr film.

B. Photolithographic process defines the gated junction area and reverse diodes area. Cr layer serves as the etching mask for the etching of $Si_3N_4$. The result is shown in C.

D. The nitride film serves as an oxidation mask and silicon is oxidized where there is no $Si_3N_4$.

E. The $Si_3N_4$ layer is etched away and a p-diffusion is accomplished in the exposed silicon areas. Simultaneously an $SiO_2$ layer is grown over the structure.

F. By photolithographic means it is possible to remove the oxide from the sense diodes and provide appropriate electrical contact to the gate junction.

G. Cup etch is preformed and the resistive sea is applied to the finished target.

The LOCOS* process is ideally suitable for such structures because the $SiO_2$ layer separates the gate and reverse diode junctions at the surface.

* The LOCOS process is described in Philips Research Reports 25, 118–131, April 1970 and 26, 157–165, June 1971, the latter also describing a silicon diode vidicon made by this process at p. 176–177.

In FIG. 1 the gating diode 3 is operated in the normal mode, it being shorted to the n-type substrate. This corresponds to an open shutter since the light-generated carriers are collected by the photo-diodes and a signal is observed as in a normal silicon vidicon tube.

Figure 2:
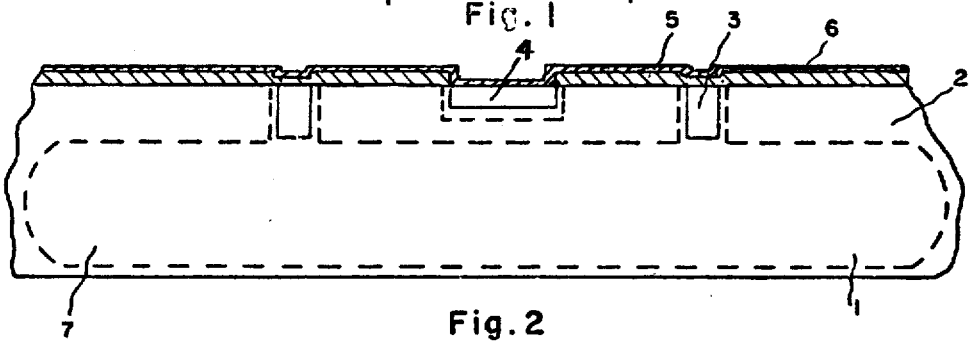
FIG. 2 shows a cross-section of the same unit cell with the gating diodes reversed biassed (shutter closed)
Figure 3:
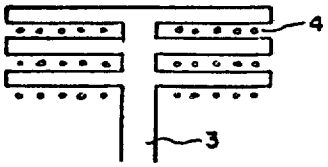
FIG. 3 shows a portion of target structure viewed from the top.

In FIG. 2, the gated diodes 3 are reversed biassed by means or battery 8. This corresponds to a closed shutter (closed gate) and the depletion region 7, shown by the dotted lines, spreads into the substrate 1 and photogenerated carriers are collected by the gate diode 3 and cannot reach the photodiode. Thus, no signal is observed.

It is also possible to obtain intermediate levels of imaging sensing capabilities by applying various values of reverse-bias to the gating diodes 3. Thus, an electronic gain control may be achieved with the gating diode.

The gated diode structure is also suitable for fabricating low blooming (SIT) Silicon Intensified Tube or (EBIC) Electron Bombardment Induced Conductivity targets since the gate junction can collect excess carriers generated by a high input signal. These excess carriers can diffuse to adjacent diodes thus causing a spread of the image. With the gate junction such blooming is inhibited because the overflow of carriers is collected by the gate diode.

It is obvious, also, that instead of silicon, a germanium, or other suitable semi-conductive wafer could be used and that the invention is not limited to silicon.

What is claimed is:

1. A device for converting light into an electrical signal comprising a semiconductive wafer having a light-receiving surface through which the light enters the wafer and produces photogenerated carriers in response to absorbed light, the wafer having adjacent one surface thereof remote from the light-receiving surface a first array of discrete rectifying barriers for collecting a flow of photo carriers in response to the absorbed light surrounded by regions free of rectifying barriers, insulating means coating said surface selectively at portions overlying regions free of rectifying barriers and leaving exposed portions overlying the rectifying barriers, and a second array of rectifying barriers interposed between those of said first array adjacent said surface and covered by said insulating means, and means to bias the rectifying barriers of said second array independently of said first array of rectifying barriers to direct at least a portion of the flow of photogenerated carriers from the first array to the second array.

2. A device as claimed in claim 1 in which the wafer consists of silicon.

3. A device as claimed in claim 2 in which the insulating material is silicon dioxide.

4. A device as claimed in claim 3 in which said insulating layer and said rectifying carriers of said first array are covered by a layer of resistive material.

5. A device as claimed in claim 4 in which the wafer consists of a substrate of uniformly doped n-type silicon.

6. A device as claimed in claim 5 in which the wafer is covered with a thin epitaxial layer of n-type silicon of lower resistivity than that of the wafer.

7. A device as claimed in claim 6 in which the epitaxial layer is doped with Sb or As.

*8. A device for converting light into an electrical signal comprising a semiconductive wafer having a light-receiving surface through which the light enters the wafer and produces photogenerated carriers in response to absorbed light, the wafer having adjacent one surface thereof and array of photosensitive elements for collecting a flow of photo carriers in response to the absorbed light, at least one rectifying barrier being disposed in projection adjacent said photosensitive elements, and means for reverse biasing said rectifying barrier independently of said array of photosensitive elements so as to extend the associated depletion zone between said light receiving surface and said array of photosensitive elements to direct at least a portion of the flow of photogenerated carriers from said array of photosensitive elements to said rectifying barrier.*

*9. A device as claimed in claim 8 in which the photosensitive elements are adjacent the surface remote from the light-receiving surface.*

* * * * *